(12) United States Patent
Bhat et al.

(10) Patent No.: US 8,673,390 B2
(45) Date of Patent: *Mar. 18, 2014

(54) METHODS OF MAKING CRYSTALLINE TANTALUM PENTOXIDE

(75) Inventors: Vishwanath Bhat, Boise, ID (US); Rishikesh Krishnan, Poughkeepsie, NY (US); Daniel F. Gealy, Kuna, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 13/614,854

(22) Filed: Sep. 13, 2012

(65) Prior Publication Data

US 2013/0011990 A1 Jan. 10, 2013

Related U.S. Application Data

(62) Division of application No. 13/210,836, filed on Aug. 16, 2011, now Pat. No. 8,282,988, which is a division of application No. 11/958,952, filed on Dec. 18, 2007, now Pat. No. 8,012,532.

(51) Int. Cl.
*B05D 5/12* (2006.01)
*B05D 3/00* (2006.01)
*C23C 16/00* (2006.01)

(52) U.S. Cl.
USPC ...... 427/79; 427/96.8; 427/98.6; 427/255.28; 427/299

(58) Field of Classification Search
USPC .............. 427/98.6, 79, 96.8, 255.28, 299
See application file for complete search history.

(56) References Cited

U.S. PATENT DOCUMENTS

| | | | |
|---|---|---|---|
| 5,256,244 | A | 10/1993 | Ackerman |
| 6,074,945 | A | 6/2000 | Vaartstra et al. |
| 6,096,592 | A | 8/2000 | Cho |
| 6,136,641 | A | 10/2000 | Won et al. |
| 6,136,704 | A | 10/2000 | Maya |
| 6,472,264 | B1 | 10/2002 | Agarwal |
| 6,559,000 | B2 | 5/2003 | Kim et al. |
| 6,656,788 | B2 | 12/2003 | Park et al. |
| 6,740,553 | B1 | 5/2004 | Lee et al. |
| 6,770,525 | B2 | 8/2004 | Lee et al. |

(Continued)

FOREIGN PATENT DOCUMENTS

| | | | |
|---|---|---|---|
| KR | 2003-0051231 | * | 6/2003 |
| KR | 20030051231 | | 6/2003 |
| WO | WO 2005/113852 | | 12/2005 |
| WO | WO 2005/117087 | | 12/2005 |

OTHER PUBLICATIONS

"Catalytic Steam Generation Systems," (Online). Ultra Clean Technology, Sieger Engineering Inc., 2007 [retrieved on Apr. 1, 2008]. Retrieved from the Internet: <URL:http://www.uct.com/products/csgt/html>; 1pg.

(Continued)

*Primary Examiner* — Brian K Talbot
(74) *Attorney, Agent, or Firm* — Wells St. John P.S.

(57) ABSTRACT

There is disclosed a method of forming crystalline tantalum pentoxide on a ruthenium-containing material having an oxygen-containing surface wherein the oxygen-containing surface is contacted with a treating composition, such as water, to remove at least some oxygen. Crystalline tantalum pentoxide is formed on at least a portion of the surface having reduced oxygen content.

8 Claims, 2 Drawing Sheets

(56) References Cited

U.S. PATENT DOCUMENTS

| | | | |
|---|---|---|---|
| 6,770,561 B2 | 8/2004 | Kim |
| 6,784,504 B2 | 8/2004 | Derderian et al. |
| 6,787,414 B2 | 9/2004 | Lee |
| 6,794,284 B2 | 9/2004 | Vaartstra |
| 6,815,221 B2 | 11/2004 | Kim et al. |
| 6,833,576 B2 | 12/2004 | Agarwal et al. |
| 6,853,535 B2 | 2/2005 | Fox et al. |
| 6,855,594 B1 | 2/2005 | Bhat et al. |
| 6,916,699 B1 | 7/2005 | Agarwal |
| 6,967,159 B2 | 11/2005 | Vaartstra |
| 7,018,675 B2 * | 3/2006 | Yang ............................ 427/250 |
| 7,030,042 B2 | 4/2006 | Vaartstra et al. |
| 7,056,784 B2 | 6/2006 | Bhat et al. |
| 7,115,929 B2 | 10/2006 | Bhat et al. |
| 7,122,464 B2 | 10/2006 | Vaartstra |
| 7,132,710 B2 | 11/2006 | Baik et al. |
| 7,153,786 B2 | 12/2006 | Kim et al. |
| 7,196,007 B2 | 3/2007 | Vaartstra |
| 7,256,123 B2 | 8/2007 | Derderian et al. |
| 7,262,132 B2 | 8/2007 | Marsh |
| 7,288,453 B2 | 10/2007 | Jeong et al. |
| 7,300,870 B2 | 11/2007 | Vaartstra |
| 7,368,402 B2 | 5/2008 | Vaartstra et al. |
| 7,402,534 B2 | 7/2008 | Mahajani |
| 7,439,564 B2 | 10/2008 | Bhat et al. |
| 7,482,037 B2 | 1/2009 | Derderian et al. |
| 7,491,347 B2 | 2/2009 | Park et al. |
| 7,544,615 B2 | 6/2009 | Vaartstra |
| 7,557,013 B2 | 7/2009 | Bhat et al. |
| 7,560,393 B2 | 7/2009 | Vaartstra |
| 7,583,534 B2 | 9/2009 | Forbes et al. |
| 7,635,623 B2 | 12/2009 | Bhat et al. |
| 7,700,454 B2 | 4/2010 | Kim et al. |
| 7,732,851 B2 | 6/2010 | Lee et al. |
| 7,759,717 B2 | 7/2010 | Bhat et al. |
| 7,858,815 B2 | 12/2010 | Vaartstra et al. |
| 8,208,241 B2 | 6/2012 | Bhat et al. |
| 2003/0020122 A1 | 1/2003 | Joo et al. |
| 2003/0109110 A1 | 6/2003 | Kim |
| 2004/0202593 A1 | 10/2004 | Phillips et al. |
| 2004/0235260 A1 | 11/2004 | Lee et al. |
| 2005/0145916 A1 | 7/2005 | Park et al. |
| 2005/0194622 A1 | 9/2005 | Lee et al. |
| 2005/0196915 A1 * | 9/2005 | Jeong et al. ................... 438/238 |
| 2005/0227003 A1 | 10/2005 | Carlson et al. |
| 2005/0238808 A1 | 10/2005 | Gatineau et al. |
| 2006/0014384 A1 | 1/2006 | Lee et al. |
| 2006/0234502 A1 | 10/2006 | Bhat et al. |
| 2006/0244033 A1 | 11/2006 | Baik et al. |
| 2006/0251813 A1 | 11/2006 | Carlson et al. |
| 2006/0292788 A1 | 12/2006 | Vaartstra |
| 2007/0048953 A1 | 3/2007 | Gealy et al. |
| 2007/0144438 A1 | 6/2007 | Vaartstra |
| 2008/0272421 A1 | 11/2008 | Bhat et al. |

OTHER PUBLICATIONS

"Ultra Clean Technology: The Leader in Gas & Liquid Delivery Systems," Press Release, Jul. 22, 2002. [retrieved on Mar. 20, 2008]. Retrieved from the Internet: <URL:http://www.uct.com/press/2002/072202.html>; 1 pg.

"WVG Water Vapor Generator, Safety & Clean Technology," datasheet. Fujikin Incorporated, Osaka, Japan, Aug. 27, 2007; 5 pages.

Cho et al., "Low Temperature Crystallized Ta2O5/Nb2O5 Bi-Layers Integrated into RIR Capacitor for 60nm Generation and Beyond," Microelectric Engineering, Jun. 17, 2005; 80:317-320. (Available online Jun. 4, 2005).

Hawley, "Condensed Chemical Dictionary," 10th Edition, Van Nostrand Reinhold Co., New York, 1981: p. 225-226.

Kingery et al., "Introduction to Ceramics," 2nd Edition, John Wiley & Sons, Hew York, NY, 1976: pp. 44-56.

Lim et al., "Improvement of Contact Resistance Between Ru Electrode and TiN Barrier in Ru/Crystalline-Ta2O5/Ru Capacitor for 50nm Dynamic Random Access Memory," Jap. J Applied Physics, Part 1, Apr. 21, 2005;44(4B):2225-2229.

Ohkawa et al., "Highly Reliable Gate Oxidation Using Catalytic Water Vapor Generator (WVG) for MOS Device Fabrication," Thin Solid Films, Feb. 2002; 405(1-2): 290-299.

Vehkamaki et al., "Growth of SrTiO3 and BaTiO3, Thin Films by Atomic Layer Deposition," Electrochemical and Solid-State Letters, Oct. 1999;2(10):504-506.

* cited by examiner

METHODS OF MAKING CRYSTALLINE TANTALUM PENTOXIDE

RELATED PATENT DATA

This application is a divisional of U.S. patent application Ser. No. 13/210,836 which was filed on Aug. 16, 2011, which is a divisional of U.S. patent application Ser. No. 11/958,952, which was filed on Dec. 18, 2007 and which is incorporated by reference herein.

BACKGROUND

The scaling down of integrated circuit devices has created a need to incorporate high dielectric constant (i.e., high dielectric permittivity) materials into capacitors and gates. The search for new high dielectric constant materials and processes is becoming more important as the minimum size for current technology is practically constrained by the use of standard dielectric materials.

Tantalum pentoxide (e.g., $Ta_2O_5$) has found interest as a high dielectric permittivity material for applications such as DRAM capacitors because of its high dielectric constant (e.g., 30) and low leakage currents. Even further interest has been directed to crystalline tantalum pentoxide for such applications, because thin films of crystalline tantalum pentoxide have dielectric constants of 60, which is about twice the dielectric constant of thin films of amorphous tantalum pentoxide. For example, tantalum pentoxide has been deposited on metallic ruthenium having a hexagonal close-packed structure to form a crystallographically textured tantalum pentoxide layer. However, because a ruthenium surface can be easily oxidized, and the oxidized surface can inhibit the formation of crystalline $Ta_2O_5$, extra measures are typically required to control the nature and composition of the ruthenium surface before and/or during the deposition process.

New methods of preparing high dielectric constant films are being sought for current and new generations of integrated circuit devices.

Figure 1:
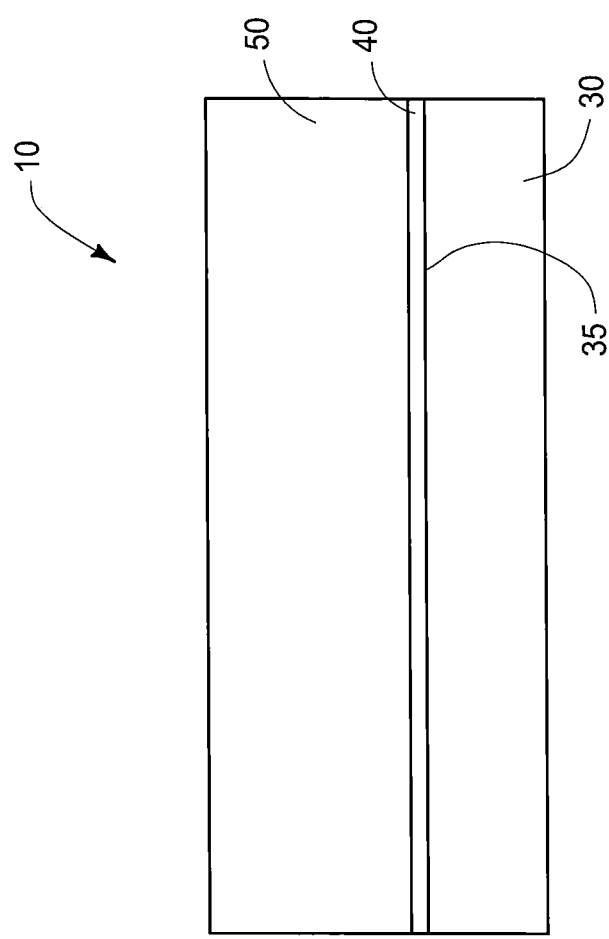
FIG. 1 is a schematic side view illustrating an embodiment of a construction having a tantalum pentoxide layer adjacent to at least a portion of a ruthenium containing material as further described in the present disclosure.

The following description of various embodiments of the methods as described herein is not intended to describe each embodiment or every implementation of such methods. Rather, a more complete understanding of the methods as described herein will become apparent and appreciated by reference to the following description and claims in view of the accompanying drawing. Further, it is to be understood that other embodiments may be utilized and structural changes may be made without departing from the scope of the present disclosure.

DETAILED DESCRIPTION OF ILLUSTRATIVE EMBODIMENTS

Ruthenium-containing materials frequently have at least one oxygen-containing surface due to the tendency of ruthenium-containing materials, especially elemental ruthenium, to oxidize. Oxidation of a surface of a ruthenium-containing material can lead to difficulties in forming a crystallographically textured tantalum pentoxide material thereon (see, for example, Cho et al., *Microelectronic Engineering*, 80 (2005) 317-320). Therefore, in order to form crystalline tantalum pentoxide on a ruthenium-containing material having at least one oxygen-containing surface, it is desirable to remove at least some of the oxygen from the oxygen-containing surface. This oxygen removal can be accomplished by contacting the oxygen-containing surface with a treating composition, such as water vapor, under conditions effective to remove at least some oxygen. Therefore, methods of forming as-deposited crystalline tantalum pentoxide on a ruthenium-containing material having at least one oxygen-containing surface are possible by removing at least some oxygen from the at least one oxygen-containing surface. Optionally, the methods may be performed without the need for high-temperature (i.e., above 500° C.) annealing.

Crystalline tantalum pentoxide formed on a ruthenium-containing material can be crystallographically textured (e.g., c-axis textured). As used herein, "a," "an," "the," "at least a," and "at least one" are used interchangeably and mean one or more than one. As used herein, "texture" or "textured" generally refers to the crystallographic orientation of the material being discussed, and is not to be confused with the surface smoothness of the material.

In certain embodiments, at least a portion of the ruthenium-containing material surface is crystalline (e.g., polycrystalline) and has a hexagonal close-packed crystalline structure. Additionally, at least a portion of the ruthenium-containing material may be crystallographically textured. The ruthenium-containing material may also be crystallographically textured in the c-axis orientation (i.e., c-axis textured).

In some embodiments, the ruthenium-containing material may be pure ruthenium (i.e., ruthenium metal). In other embodiments, the ruthenium-containing material may, in addition to ruthenium, contain other elements, including, but not limited to, oxygen. Ruthenium metal may also be crystalline having a hexagonal close-packed structure. Further, ruthenium metal may also be c-axis textured.

The ruthenium-containing materials in embodiments described herein may take any shape or be any size. Some ruthenium-containing materials are ruthenium-containing layers which may or may not be a blanket film. As used herein, a blanket film may be any unpatterned deposition that may coat a portion of a substrate surface up to and including an entire substrate surface. In certain embodiments, the ruthenium-containing material can be a layer having a thickness of from 100 Å to 300 Å, although the thickness can be selected as desired from within or outside this range depending on the particular application. Some ruthenium-containing materials may have more aggressive topologies. For instance, the ruthenium-containing material may, as part of substrate, take the form of one or more cavities, cylinders, containers, vias, stacks, and other semiconductor features, and combinations thereof. As used herein, the term "or" is generally employed in the sense as including "and/or" unless the context of the usage clearly indicates otherwise. As used herein, the recitations of numerical ranges by endpoints include all numbers subsumed within that range (e.g., 1 to 5 includes 1, 1.5, 2, 2.75, 3, 3.80, 4, 5, etc.).

The ruthenium-containing material as described herein may be used in any application where crystalline tantalum pentoxide is formed thereon. For instance, the ruthenium-containing material may be a part of a substrate, semiconductor substrate or substrate assembly. Optionally, the ruthenium-containing material may be used as one or more electrodes in capacitor or gate applications. Specifically, the ruthenium-containing material may be one or more electrodes as a part or parts of a semiconductor device, such as a DRAM capacitor. In some embodiments, the ruthenium-containing material is a bottom electrode in a capacitor construction.

Methods of making a ruthenium-containing material are well-known in the art. (See U.S. Pat. No. 7,018,675 (Yang), U.S. Pat. No. 6,784,504 (Derderian et al.), and U.S. Pat. No. 6,074,945 (Vaartstra et al.).)

Typically, ruthenium-containing materials are prone to oxidation. The ruthenium-containing surface in most embodiments comprises at least one oxygen-containing surface. The oxygen-containing surface may also contain other elements including, but not limited to, ruthenium. The oxygen-containing surface may comprise ruthenium oxide, $RuO_x$ (e.g., $RuO_2$). In some embodiments, oxidation of at least a portion of the ruthenium-containing material can occur before, during, and/or after forming crystalline tantalum pentoxide thereon, to form ruthenium oxide adjacent to at least a portion of the surface.

The nucleation of a textured crystalline tantalum pentoxide on a ruthenium-containing material is very sensitive to the surface of the ruthenium-containing material. Specifically, a significant level of oxygen in an oxygen-containing surface of a ruthenium-containing material may cause difficulty in forming crystallographically textured crystalline tantalum pentoxide thereon (see, for example, Cho et al., *Microelectronic Engineering*, 80 (2005) 317-320). On an atomic concentration basis, a concentration of 40 atomic percent or greater of oxygen in the oxygen-containing surface would likely cause difficulty in nucleating a crystalline tantalum pentoxide layer thereon. On the other hand, a reduction of oxygen concentration in the oxygen-containing surface to 20 atomic percent or less allows nucleation of a crystalline tantalum pentoxide which may optionally be crystallographically textured.

In order to form crystalline tantalum pentoxide on a ruthenium-containing material with at least one oxygen containing surface, it is desirable to remove at least some of the oxygen from the oxygen-containing surface. This can be accomplished by contacting the oxygen-containing surface with a treating composition under conditions effective to remove at least some oxygen.

A treating composition may include one or more compounds capable of removing oxygen from an oxygen-containing surface of a ruthenium-containing material. For instance, the treating composition may comprise one or more of water vapor, hydrogen plasma, ammonia plasma, hydrazine, monomethyl hydrazine, carbon dioxide, and combinations thereof. In particular, an oxygen-containing surface may be contacted with low pressure water vapor to remove at least some oxygen from the oxygen-containing surface on the ruthenium-containing material. Effective removal of some oxygen can occur when the temperature of the ruthenium-containing material having the oxygen-containing surface is less than or equal to 500° C., but in other embodiments, less than or equal to 450° C. and in still more embodiments, less than or equal to 400° C. The temperature of the ruthenium-containing material during contacting with a treating composition is typically at least 350° C., and in some embodiments at least 375° C. Typically, the ruthenium-containing material is in a deposition chamber at a pressure of $10^{-6}$ torr ($1.3 \times 10^{-4}$ Pascal, "Pa") to 20 torr ($2.7 \times 10^3$ Pa) during contacting with a treating composition. In some embodiments, the pressure of a treating composition, such as water vapor, may be 0.5 torr to 20 torr. From 2 minutes to 20 minutes is an effective time for a treating composition, such as water vapor, to contact the oxygen-containing surface for effective removal of some oxygen therefrom. The treating compositions can contact the oxygen-containing surface by utilizing a vapor deposition process.

Formation of crystalline tantalum pentoxide provides a material with a dielectric constant useful in any application in which high-k materials are desired. In particular, crystalline tantalum pentoxide can be used as a dielectric material, especially as one or more dielectric layers on substrates, semiconductor substrates, and substrate assemblies. Crystalline tantalum pentoxide, as a high-k material, is also useful as one or more dielectric parts of a semiconductor device, such as a capacitor or gate in a DRAM cell. In certain embodiments, the crystalline tantalum pentoxide has a dielectric constant of from 40 to 110. In other certain embodiments, the crystalline tantalum pentoxide layer has a dielectric constant of at least 50. In certain embodiments, crystalline tantalum pentoxide can be a layer having a thickness of from 60 Å to 200 Å, although the thickness can be selected as desired from within or outside this range depending on the particular application.

In some embodiments, crystalline tantalum pentoxide has a hexagonal close-packed crystalline structure (e.g., a hexagonal phase). Optionally, the hexagonal close-packed crystalline tantalum pentoxide may be crystallographically textured. Specifically, the crystalline tantalum pentoxide may be crystallographically textured in the c-axis orientation (i.e., c-axis textured).

In certain embodiments, the crystalline tantalum pentoxide is formed on a ruthenium-containing material comprising at least one oxygen-containing surface having been contacted with a treating composition for removal of at least some oxygen. The crystalline tantalum pentoxide may be formed on at least a portion of the at least one oxygen-containing surface having oxygen removed therefrom. In some embodiments, the crystalline tantalum pentoxide is formed on a blanket film topology. In other embodiments, the crystalline tantalum pentoxide may be formed on an aggressive topology, such as on a DRAM cell having one or more features including, but not limited to, stacks, cylinders, containers, and openings. The crystalline tantalum pentoxide may be formed in a layer, such as a dielectric layer. The crystalline tantalum pentoxide formed may be any size useful for a dielectric device.

The crystalline tantalum pentoxide formed in most embodiments is tantalum pentoxide in the substantial absence of impurities. As used herein, the "substantial absence" of impurities means that no more than insignificant amounts of impurities (e.g., less than 1 atomic percent) might be present in the crystalline tantalum pentoxide.

Formation of an amorphous tantalum pentoxide may be followed by annealing lasting one or more time periods of 0.5 minutes to 2 hours and frequently involving temperatures from greater than 500° C. to 1000° C. In certain embodiments, after at least some oxygen is removed from the oxygen-containing surface of the ruthenium-containing material, as-deposited crystalline tantalum pentoxide may be formed thereon. That is, the tantalum pentoxide can be formed in a crystalline structure, not in an amorphous state. Thus, crystalline tantalum pentoxide may be formed without annealing in some embodiments. Further, in other embodiments, the as-deposited crystalline tantalum pentoxide may be as-deposited crystallographically textured crystalline tantalum pentoxide, such as in the c-axis orientation (i.e., c-axis textured). When no annealing is required to crystallize the formed tantalum pentoxide, the temperature of the surface on which the crystalline tantalum pentoxide is formed may remain less than or equal to 500° C. In other embodiments, the temperature may remain less than or equal to 450° C. and in others less than or equal to 400° C.

In certain embodiments, the temperature of contacting may be substantially equal to the temperature of forming crystalline tantalum pentoxide. For example, contacting can be at a first temperature, and forming crystalline tantalum pentoxide can occur at substantially the same temperature or, optionally, at a substantially different temperature. Clearly, some small variation in temperature, as judged by those of ordinary skill, can occur but still be considered substantially the same temperature. Alternately, in various embodiments, the difference in temperatures between the contacting and forming may be less than or equal to 150° C., 50° C., 25° C., or 10° C., or may be less than 5° C. Alternatively, the contacting and forming could instead occur at substantially exactly the same temperature.

Some embodiments allow the contacting and forming to occur in situ. In such embodiments, the contacting to remove at least some oxygen from the oxygen-containing surface and the forming of crystalline tantalum pentoxide may occur in the same deposition chamber. Optionally, in other embodiments, the contacting and forming may occur ex situ. In such embodiments, the ruthenium-containing material may be moved between the contacting and forming, including movement to one or more other deposition chambers.

Tantalum pentoxide can be deposited on a surface of a ruthenium-containing material having a hexagonal close-packed structure to form a crystalline tantalum pentoxide layer. Such constructions having ruthenium-containing materials and crystalline tantalum pentoxide can be useful as portions of or intermediates for making, capacitors (e.g., DRAM applications), in which an electrode includes a ruthenium-containing material and the crystalline tantalum pentoxide forms a dielectric layer. The electrode including a ruthenium-containing material may have a blanket film topology or may have a more aggressive topology, such as DRAM topology. The tantalum pentoxide may be as-deposited crystalline. In certain embodiments, the tantalum pentoxide has a hexagonal structure. In certain embodiments, the tantalum pentoxide layer has a dielectric constant of at least 50. Optionally, a second electrode can formed on at least a portion of the dielectric layer. The second electrode can include a wide variety of materials known for use as electrodes. For example, such materials can include, but are not limited to, iridium, ruthenium, niobium nitride, tantalum nitride, hafnium nitride, and combinations thereof.

The following examples are offered to further illustrate various specific embodiments and techniques of the present disclosure. It should be understood, however, that many variations and modifications understood by those of ordinary skill in the art may be made while remaining within the scope of the present disclosure. Therefore, the scope of the present disclosure is not intended to be limited by the following examples.

An example construction 10 is schematically illustrated in FIG. 1. Construction 10 includes a crystalline tantalum pentoxide layer 50 adjacent to at least a portion of a ruthenium-containing material 30. The ruthenium-containing material 30 can be a layer and can have any suitable thickness. In some embodiments, ruthenium 30 has a thickness of from 100 Å to 300 Å. In some embodiments, at least the surface of the ruthenium-containing material 30 is ruthenium and has a c-axis crystallographically textured hexagonal close-packed structure. Optionally, construction 10 can include an oxygen-containing surface 40 adjacent to at least a portion of surface 35 of the ruthenium-containing material 30. Although the oxygen-containing surface 40 appears to have a uniform thickness in FIG. 1, the present disclosure should be broadly construed to include embodiments in which the oxygen-containing surface is non-uniformly thick, non-contiguous, and/or of non-uniform composition. In some embodiments, the oxygen-containing material is ruthenium oxide. Construction 10 further includes a crystalline tantalum pentoxide layer 50 on at least a portion of the oxygen-containing surface 40, having been deposited after at least a portion of the oxygen was removed from the oxygen-containing surface 40. "Layer," as used herein, is meant to include layers specific to the semiconductor industry, such as, but clearly not limited to, a barrier layer, dielectric layer (i.e., a layer having a high dielectric constant), and conductive layer. The term "layer" is synonymous with the term "film" frequently used in the semiconductor industry. The term "layer" is also meant to include layers found in technology outside of semiconductor technology, such as coatings on glass. For example, such layers can be formed directly on fibers, wires, etc., which are substrates other than semiconductor substrates. Further, the layers can be formed adjacent to (e.g., directly on) the lowest semiconductor surface of the substrate, or they can be formed adjacent to any of a variety of layers (e.g., surfaces) as in, for example, a patterned wafer. As used herein, layers need not be continuous, and in certain embodiments are discontinuous. Unless otherwise stated, as used herein, a layer or material "adjacent to" or "on" a surface (or another layer) is intended to be broadly interpreted to include not only constructions having a layer or material directly on the surface, but also constructions in which the surface and the layer or material are separated by one or more additional materials (e.g., layers).

The ruthenium-containing material 30 can be formed or deposited, for example, adjacent to a substrate, (e.g., a semiconductor substrate or substrate assembly), which is not illustrated in FIG. 1. "Semiconductor substrate" or "substrate assembly" as used herein refer to a semiconductor substrate such as a base semiconductor material or a semiconductor substrate having one or more materials, structures, or regions formed thereon. A base semiconductor material is typically the lowest silicon material on a wafer or a silicon material deposited adjacent to another material, such as silicon on sapphire. When reference is made to a substrate assembly, various process steps may have been previously used to form or define regions, junctions, various structures or features, and openings such as transistors, active areas, diffusions, implanted regions, vias, contact openings, high aspect ratio openings, capacitor plates, barriers for capacitors, etc.

Suitable substrate materials of the present disclosure include conductive materials, semiconductive materials, conductive metal-nitrides, conductive metals, conductive metal oxides, etc. The substrate can be a semiconductor substrate or substrate assembly. A wide variety of semiconductor materials are contemplated, such as for example, borophosphosilicate glass (BPSG), silicon such as, e.g., conductively doped polysilicon, monocrystalline silicon, etc. (for this disclosure, appropriate forms of silicon are simply referred to as "silicon"), for example in the form of a silicon wafer, tetraethylorthosilicate (TEOS) oxide, spin on glass (i.e., $SiO_2$, optionally doped, deposited by a spin on process), TiN, TaN, W, Ru, Al, Cu, noble metals, etc. A substrate assembly may also include a portion that includes platinum, iridium, iridium oxide, rhodium, ruthenium, ruthenium oxide, strontium ruthenate, lanthanum nickelate, titanium nitride, tantalum nitride, tantalum-silicon-nitride, silicon dioxide, aluminum, gallium arsenide, glass, etc., and other existing or to-be-developed materials used in semiconductor constructions, such as dynamic random access memory (DRAM) devices, static random access memory (SRAM) devices, and ferroelectric memory (FERAM) devices, for example.

For substrates including semiconductor substrates or substrate assemblies, ruthenium-containing material 30 can be formed adjacent to or directly on the lowest semiconductor surface of the substrate, or they can be formed adjacent to any of a variety of other surfaces as in a patterned wafer, for example.

Substrates other than semiconductor substrates or substrate assemblies can also be used in presently disclosed methods. Any substrate that may advantageously form a ruthenium-containing material 30 thereon may be used, such substrates including, for example, fibers, wires, etc.

Metal-containing materials (e.g., ruthenium-containing materials and/or crystalline tantalum pentoxide-containing materials) as described herein can be formed by a wide variety of deposition methods including, for example, evaporation, physical vapor deposition (PVD or sputtering), and/or vapor deposition methods such as chemical vapor deposition (CVD) or atomic layer deposition (ALD).

Metal-containing precursor compositions can be used to form metal-containing materials (e.g., ruthenium-containing materials and/or tantalum pentoxide-containing materials) in various embodiments described in the present disclosure. As used herein, "metal-containing" is used to refer to a material, typically a compound or a layer, that may consist entirely of a metal, or may include other elements in addition to a metal. Typical metal-containing compounds include, but are not limited to, metals, metal-ligand complexes, metal salts, organometallic compounds, and combinations thereof Typical metal-containing layers include, but are not limited to, metals, metal oxides, metal nitrides, and combinations thereof Various metal-containing compounds can be used in various combinations, optionally with one or more organic solvents (particularly for CVD processes), to form a metal-containing precursor composition. Some of the metal-containing compounds disclosed herein can be used in ALD without adding solvents. "Precursor" and "precursor composition" as used herein, refer to a composition usable for forming, either alone or with other precursor compositions (or reactants), a material adjacent to a substrate assembly in a deposition process. Further, one skilled in the art will recognize that the type and amount of precursor used will depend on the content of a material which is ultimately to be formed using a vapor deposition process. In certain embodiments of the methods as described herein, the precursor compositions are liquid at the vaporization temperature, and sometimes liquid at room temperature.

The precursor compositions may be liquids or solids at room temperature, and for certain embodiments are liquids at the vaporization temperature. Typically, they are liquids sufficiently volatile to be employed using known vapor deposition techniques. However, as solids they may also be sufficiently volatile that they can be vaporized or sublimed from the solid state using known vapor deposition techniques. If they are less volatile solids, they can be sufficiently soluble in an organic solvent or have melting points below their decomposition temperatures such that they can be used, for example, in flash vaporization, bubbling, microdroplet formation techniques, etc.

Herein, vaporized metal-containing compounds may be used either alone or optionally with vaporized molecules of other metal-containing compounds or optionally with vaporized solvent molecules or inert gas molecules, if used. As used herein, "liquid" refers to a solution or a neat liquid (a liquid at room temperature or a solid at room temperature that melts at an elevated temperature). As used herein, "solution" does not require complete solubility of the solid but may allow for some undissolved solid, as long as there is a sufficient amount of the solid delivered by the organic solvent into the vapor phase for chemical vapor deposition processing. If solvent dilution is used in deposition, the total molar concentration of solvent vapor generated may also be considered as an inert carrier gas.

"Inert gas" or "non-reactive gas," as used herein, is any gas that is generally unreactive with the components it comes in contact with. For example, inert gases are typically selected from a group including nitrogen, argon, helium, neon, krypton, xenon, any other non-reactive gas, and mixtures thereof. Such inert gases are generally used in one or more purging processes as described herein, and in some embodiments may also be used to assist in precursor vapor transport.

Solvents that are suitable for certain embodiments of methods as described herein may be one or more of the following: aliphatic hydrocarbons or unsaturated hydrocarbons (C3-C20, and in certain embodiments C5-C10, cyclic, branched, or linear), aromatic hydrocarbons (C5-C20, and in certain embodiments C5-C10), halogenated hydrocarbons, silylated hydrocarbons such as alkylsilanes, alkylsilicates, ethers, cyclic ethers (e.g., tetrahydrofuran, THF), polyethers, thioethers, esters, lactones, nitriles, silicone oils, or compounds containing combinations of any of the above or mixtures of one or more of the above. The compounds are also generally compatible with each other, so that mixtures of variable quantities of the metal-containing compounds will not interact to significantly change their physical properties.

Methods as described herein use metal precursor compounds. As used herein, a "metal precursor compound" is used to refer to a compound that can provide a source of the metal in an atomic layer deposition method. Further, in some embodiments, the methods include "metal-organic" precursor compounds. The term "metal-organic" is intended to be broadly interpreted as referring to a compound that includes, in addition to a metal, an organic group (i.e., a carbon-containing group). Thus, the term "metal-organic" includes, but is not limited to, organometallic compounds, metal-ligand complexes, metal salts, and combinations thereof Ruthenium-containing materials can be formed from a wide variety of ruthenium-containing precursor compounds using vapor deposition methods. Ruthenium-containing precursor compounds known in the art include, for example, ruthenium carbonyls, such as organoruthenium complexes, such as bis(cyclopenta-dienyl)ruthenium ($Ru(C_5H_5)_2$), ruthenium carbonyls, such as $Ru(CO)_5$, and $Ru_2(CO)_9$ and $Ru_3(CO)_{12}$, tricarbonyl(1,3-cyclohexadiene)ruthenium, tricarbonyl(cyclopentadienyl)ruthenium, and the like, and combinations thereof as described, for example, in U.S. Pat. No. 7,256,123 (Derderian et al.) and U.S. Pat. No. 7,262,132 (Marsh) and U.S. Patent Publication No. 2005/0238808 (Gatineau et al.). A halogenated ruthenium compound such as ruthenium tetrachloride ($RuCl_4$), $RuCl_3$, or $RuF_5$ could be used and combinations thereof as described, for example, in U.S. Pat. No. 7,256,123 (Derderian et al.).

Crystalline tantalum pentoxide, including tantalum pentoxide-containing layers, can be formed from a wide variety of tantalum-containing precursor compounds using vapor deposition methods. Tantalum-containing precursor compounds known in the art include, for example, tantalum methoxide ($Ta(OMe)_5$); tantalum ethoxide ($Ta(OEt)_5$); tantalum butoxide ($Ta(OBu)_5$); tantalum halides such as tantalum fluoride ($TaF_5$), tantalum chloride ($TaCl_5$), and tantalum iodide ($TaI_5$); pentakis(dimethylamino)tantalum, tris(diethylamino)(ethylimino)tantalum, tris(diethylamino)(tert-butylimino)tantalum; other tantalum-containing precursor compounds (all available from Sigma-Aldrich Chemical Company, Milwaukee, Wis.) as described in U.S. Pat. No. 7,030,042 B2 (Vaartstra et al.); and combinations thereof, wherein Me is methyl, Et is ethyl, and Bu is butyl.

In certain embodiments, a crystalline tantalum pentoxide material or layer can be formed by a vapor deposition method using at least one tantalum-containing precursor compound and optionally at least one reaction gas as described, for example, in U.S. Pat. No. 7,030,042 B2 (Vaartstra et al.). Such a crystalline tantalum pentoxide material may be formed by contacting at least one tantalum-containing precursor compound and optionally at least one reaction gas on at least a portion of a ruthenium-containing material wherefrom a treating composition, such as water vapor, removed at least some oxygen. In some embodiments, a reaction gas is water vapor, ozone, or combinations thereof.

Precursor compositions as described herein can, optionally, be vaporized and deposited/chemisorbed substantially simultaneously with, and in the presence of, one or more reaction gases. Alternatively, metal-containing materials may be formed by alternately introducing the precursor composition and the reaction gas(es) during each deposition cycle. Such reaction gases can include, for example, oxygen-containing sources, which can be oxidizing gases. A wide variety of suitable oxidizing gases can be used including, for example, oxygen, water vapor, ozone, hydrogen peroxide, alcohols (e.g., isopropanol), and combinations thereof.

The precursor compositions can be vaporized in the presence of an inert carrier gas if desired. Additionally, an inert carrier gas can be used in purging steps in an ALD process (discussed below). The inert carrier gas is typically nitrogen, argon, helium, neon, krypton, xenon, any other non-reactive gas, and mixtures thereof, etc. In the context of the present disclosure, an inert carrier gas is one that does not interfere with the formation of the metal-containing material. Whether done in the presence of an inert carrier gas or not, the vaporization can be done in the absence of oxygen to avoid oxygen contamination (e.g., oxidation of silicon to form silicon dioxide or oxidation of precursor in the vapor phase prior to entry into the deposition chamber).

The terms "deposition process" and "vapor deposition process" as used herein refer to a process in which a metal-containing material is formed adjacent to one or more surfaces of a substrate (e.g., a doped polysilicon wafer) from vaporized precursor composition(s) including one or more metal-containing compound(s). Specifically, one or more metal-containing compounds are vaporized and directed to and/or contacted with one or more surfaces of a substrate (e.g., semiconductor substrate or substrate assembly) placed in a deposition chamber. Typically, the substrate is heated. These metal-containing compounds can form (e.g., by reacting or decomposing) a non-volatile, thin, uniform, metal-containing material adjacent to the surface(s) of the substrate. For the purposes of this disclosure, the term in "vapor deposition process" is meant to include both chemical vapor deposition processes (including pulsed chemical vapor deposition processes) and atomic layer deposition processes.

Chemical vapor deposition (CVD) and atomic layer deposition (ALD) are two vapor deposition processes often employed to form thin, continuous, uniform, metal-containing materials onto semiconductor substrates. Using either vapor deposition process, typically one or more precursor compositions are vaporized in a deposition chamber and optionally combined with one or more reaction gases and directed to and/or contacted with the substrate to form a metal-containing material on the substrate. It will be readily apparent to one skilled in the art that the vapor deposition process may be enhanced by employing various related techniques such as plasma assistance, photo assistance, laser assistance, as well as other techniques.

"Chemical vapor deposition" (CVD) as used herein refers to a vapor deposition process wherein the desired layer is deposited on the substrate from vaporized metal-containing compounds (and any reaction gases used) within a deposition chamber with no effort made to separate the reaction components. In contrast to a "simple" CVD process that involves the substantial simultaneous use of the precursor compositions and any reaction gases, "pulsed" CVD alternately pulses these materials into the deposition chamber, but does not rigorously avoid intermixing of the precursor and reaction gas streams, as is typically done in atomic layer deposition or ALD (discussed in greater detail below).

Chemical vapor deposition (CVD) has been extensively used for the preparation of metal-containing layers, such as dielectric layers, in semiconductor processing because of its ability to provide conformal and high quality dielectric layers at relatively fast processing times. Typically, the desired precursor compositions are vaporized and then introduced into a deposition chamber containing a heated substrate with optional reaction gases and/or inert carrier gases in a single deposition cycle. In a typical CVD process, vaporized precursors are contacted with reaction gas(es) at the substrate surface to form a layer (e.g., dielectric layer). The single deposition cycle is allowed to continue until the desired thickness of the layer is achieved.

Typical CVD processes generally employ precursor compositions in vaporization chambers that are separated from the process chamber wherein the deposition surface or wafer is located. For example, liquid precursor compositions are typically placed in bubblers and heated to a temperature at which they vaporize, and the vaporized liquid precursor composition is then transported by an inert carrier gas passing over the bubbler or through the liquid precursor composition. The vapors are then swept through a gas line to the deposition chamber for depositing a layer on substrate surface(s) therein. Many techniques have been developed to precisely control this process. For example, the amount of precursor composition transported to the deposition chamber can be precisely controlled by the temperature of the reservoir containing the precursor composition and by the flow of an inert carrier gas bubbled through or passed over the reservoir.

A typical CVD process may be carried out in a chemical vapor deposition reactor, such as a deposition chamber available under the trade designation of 7000 from Genus, Inc. (Sunnyvale, Calif.), a deposition chamber available under the trade designation of 5000 from Applied Materials, Inc. (Santa Clara, Calif.), or a deposition chamber available under the trade designation of Prism from Novelus, Inc. (San Jose, Calif.). However, any deposition chamber suitable for performing CVD may be used.

Several modifications of the CVD chambers are possible, for example, using atmospheric pressure chemical vapor deposition, low pressure chemical vapor deposition (LPCVD), plasma enhanced chemical vapor deposition (PECVD), hot wall or cold wall reactors or any other chemical vapor deposition technique. Furthermore, pulsed CVD can be used, which is similar to ALD but does not rigorously avoid intermixing of precursor and reactant gas streams. Also, for pulsed CVD, the deposition thickness is dependent on the exposure time, as opposed to ALD, which is self-limiting (discussed in more detail below).

The term "atomic layer deposition" (ALD) as used herein refers to a vapor deposition process in which deposition cycles, for example a plurality of consecutive deposition cycles, are conducted in a process chamber (i.e., a deposition chamber). As used herein, a "plurality" means two or more. Typically, during each cycle a precursor is chemisorbed to a deposition surface (e.g., a substrate assembly surface or a previously deposited underlying surface such as material from a previous ALD cycle), forming a monolayer or sub-monolayer that does not readily react with additional precursor (i.e., a self-limiting reaction). Thereafter, if necessary, a reactant (e.g., another precursor or reaction gas) may subsequently be introduced into the process chamber for use in converting the chemisorbed precursor to the desired material on the deposition surface. Typically, this reactant is capable of further reaction with the precursor. Further, purging steps may also be utilized during each cycle to remove excess precursor from the process chamber and/or remove excess reactant and/or reaction byproducts from the process chamber after conversion of the chemisorbed precursor. Further, the term "atomic layer deposition," as used herein, is also meant to include processes designated by related terms such as, "chemical vapor atomic layer deposition," "atomic layer epitaxy" (ALE) (see U.S. Pat. No. 5,256,244 to Ackerman), molecular beam epitaxy (MBE), gas source MBE, or organometallic MBE, and chemical beam epitaxy when performed with alternating pulses of precursor composition(s), reactive gas, and purge (e.g., inert carrier) gas.

The vapor deposition process employed in some methods of the present disclosure can be a multi-cycle atomic layer deposition (ALD) process. Such a process is advantageous, in particular advantageous over a CVD process, in that it provides for improved control of atomic-level thickness and uniformity to the deposited material (e.g., dielectric layer) by providing a plurality of self-limiting deposition cycles. The self-limiting nature of ALD provides a method of depositing a film adjacent to a wide variety of reactive surfaces including, for example, surfaces with irregular topographies, with better step coverage than is available with CVD or other "line of sight" deposition methods (e.g., evaporation and physical vapor deposition, i.e., PVD or sputtering). Further, ALD processes typically expose the metal-containing compounds to lower volatilization and reaction temperatures, which tend to decrease degradation of the precursor as compared to, for example, typical CVD processes.

Generally, in an ALD process each reactant is pulsed onto a suitable substrate, typically at deposition temperatures of at least 25° C., in certain embodiments at least 150° C., and in other embodiments at least 200° C. Typical ALD deposition temperatures are less than or equal to 400° C., in certain embodiments less than or equal to 350° C., and in other embodiments less than or equal to 250° C. These temperatures are generally lower than those presently used in CVD processes, which typically include deposition temperatures at the substrate surface of at least 150° C., in some embodiments at least 200° C., and in other embodiments at least 250° C. In most embodiments, CVD deposition temperatures are less than or equal to 500° C., in certain embodiments less than or equal to 450° C., and in other embodiments less than or equal to 400° C.

A typical ALD process includes exposing a substrate (which may optionally be pretreated with, for example, water and/or ozone) to a first chemical to accomplish chemisorption of the chemical onto the substrate. The term "chemisorption" as used herein refers to the chemical adsorption of vaporized reactive metal-containing compounds on the surface of a substrate. The adsorbed chemicals are typically irreversibly bound to the substrate surface as a result of relatively strong binding forces characterized by high adsorption energies (e.g., >30 kcal/mol), comparable in strength to ordinary chemical bonds. The chemisorbed chemicals typically form a monolayer on the substrate surface. (See "The Condensed Chemical Dictionary," 10th edition, revised by G. G. Hawley, published by Van Nostrand Reinhold Co., N.Y., 225 (1981)). In ALD one or more appropriate precursor compositions or reaction gases are alternately introduced (e.g., pulsed) into a deposition chamber and chemisorbed onto the surfaces of a substrate. Each sequential introduction of a reactive compound (e.g., one or more precursor compositions and one or more reaction gases) is typically separated by an inert carrier gas purge to provide for deposition and/or chemisorption of a second reactive compound in the substantial absence of the first reactive compound. As used herein, the "substantial absence" of the first reactive compound during deposition and/or chemisorption of the second reactive compound means that no more than insignificant amounts of the first reactive compound might be present. According to the knowledge of one of ordinary skill in the art, a determination can be made as to the tolerable amount of the first reactive compound, and process conditions can be selected to achieve the substantial absence of the first reactive compound.

Each precursor composition co-reaction adds a new atomic layer to previously deposited layers to form a cumulative solid. The cycle is repeated to gradually form the desired thickness. It should be understood that ALD can alternately utilize one precursor composition, which is chemisorbed, and one reaction gas, which reacts with the chemisorbed precursor composition.

A typical ALD process includes exposing an initial substrate to a first chemical A (e.g., a precursor composition such as a metal-containing compound as described herein or a reaction gas), to accomplish chemisorption of chemical A onto the substrate. Chemical A can react either with the substrate surface or with chemical B (described below), but not with itself. When chemical A is a metal-containing compound having ligands, one or more of the ligands is typically displaced by reactive groups on the substrate surface during chemisorption. Theoretically, the chemisorption fauns a monolayer that is uniformly one atom or molecule thick on the entire exposed initial substrate, the monolayer being composed of chemical A, less any displaced ligands. In other words, a saturated monolayer is substantially formed on the substrate surface.

Substantially all non-chemisorbed molecules of chemical A as well as displaced ligands are purged from over the substrate and a second chemical, chemical B (e.g., a different metal-containing compound or reaction gas) is provided to react with the monolayer of chemical A. Chemical B typically displaces the remaining ligands from the chemical A monolayer and thereby is chemisorbed and forms a second monolayer. This second monolayer displays a surface which is reactive only to chemical A. Non-chemisorbed chemical B, as well as displaced ligands and other byproducts of the reaction are then purged and the steps are repeated with exposure of the chemical B monolayer to vaporized chemical A. Optionally, chemical B can react with chemical A, but not chemisorb additional material thereto. That is, chemical B can cleave some portion of the chemisorbed chemical A, altering such monolayer without forming another monolayer thereon, but leaving reactive sites available for formation of subsequent monolayers. In other ALD processes, a third or more chemicals may be successively chemisorbed (or reacted) and purged just as described for chemical A and chemical B, with the understanding that each introduced chemical reacts with the monolayer produced immediately prior to its introduction. Optionally, chemical B (or third or subsequent chemicals) can include at least one reaction gas if desired.

Practically, chemisorption might not occur on all portions of the deposition surface (e.g., previously deposited ALD material). Nevertheless, such imperfect monolayer is still considered a monolayer in the context of the present disclosure. In many applications, merely a substantially saturated monolayer may be suitable. In one aspect, a substantially saturated monolayer is one that will still yield a deposited monolayer or less of material exhibiting the desired quality and/or properties. In another aspect, a substantially saturated monolayer is one that is self-limited to further reaction with precursor.

The film growth by ALD is typically self-limiting (i.e., when the reactive sites on a surface are depleted in an ALD process, the deposition generally stops), which can provide for substantial deposition conformity within a wafer and deposition thickness control. Due to alternate dosing of the precursor compositions and/or reaction gases, detrimental vapor-phase reactions are inherently diminished, in contrast to the CVD process that is carried out by continuous co-reaction of the precursors and/or reaction gases. (See Vehkamäki et al, "Growth of $SrTiO_3$ and $BaTiO_3$ Thin Films by Atomic Layer Deposition," Electrochemical and Solid-State Letters, 2(10):504-506 (1999)).

ALD is often described as a self-limiting process, in that a finite number of reactive sites exist on a substrate to which the first chemical may form chemical bonds. The second chemical might only react with the surface created from the chemisorption of the first chemical and thus, may also be self-limiting. Once all of the finite number of reactive sites on a substrate are bonded with a first chemical, the first chemical will not bond to other of the first chemicals already bonded with the substrate. However, process conditions can be varied in ALD to promote such bonding and render ALD not self-limiting, e.g., more like pulsed CVD. Accordingly, ALD may also encompass chemicals forming other than one monolayer at a time by stacking of chemicals, forming a material more than one atom or molecule thick.

Thus, during the ALD process, numerous consecutive deposition cycles can be conducted in the deposition chamber, each cycle depositing a very thin metal-containing layer (usually less than one monolayer such that the growth rate on average is 0.02 to 0.3 nanometers per cycle), until material of the desired thickness is built up adjacent to the substrate of interest. The deposition can be accomplished by alternately introducing (i.e., by pulsing) precursor composition(s) into the deposition chamber containing a substrate, chemisorbing the precursor composition(s) as a monolayer onto the substrate surfaces, purging the deposition chamber, then introducing to the chemisorbed precursor composition(s) reaction gases and/or other precursor composition(s) in a plurality of deposition cycles until the desired thickness of the metal-containing material is achieved.

Thus, the use of ALD typically provides the ability to improve the control of thickness, composition, and uniformity of metal-containing materials adjacent to a substrate. For example, depositing thin layers of metal-containing compound in a plurality of cycles provides a more accurate control of ultimate film thickness. This is particularly advantageous when precursor composition(s) are directed to the substrate and allowed to chemisorb thereon, optionally further including at least one reaction gas that can react with the chemisorbed precursor composition(s) on the substrate, and in certain embodiments wherein this cycle is repeated at least once.

Purging of excess vapor of each chemical following deposition and/or chemisorption onto a substrate may involve a variety of techniques including, but not limited to, contacting the substrate and/or monolayer with an inert carrier gas and/or lowering pressure to below the deposition pressure to reduce the concentration of a chemical contacting the substrate and/or chemisorbed chemical. Examples of inert carrier gases, as discussed above, may include $N_2$, Ar, He, etc. Additionally, purging may instead include contacting the substrate and/or monolayer with any substance that allows chemisorption by-products to desorb and reduces the concentration of a contacting chemical preparatory to introducing another chemical. The contacting chemical may be reduced to some suitable concentration or partial pressure known to those skilled in the art based on the specifications for the product of a particular deposition process.

The pulse duration of precursor composition(s) and inert carrier gas(es) is generally of a duration sufficient to saturate the substrate surface. Typically, the pulse duration is at least 0.1 seconds, in certain embodiments at least 0.2 second, and in other embodiments at least 0.5 second. Typically pulse durations are generally less than or equal to 2 minutes, and in certain embodiments less than or equal to 1 minute.

In comparison to the predominantly thermally driven CVD, ALD is predominantly chemically driven. Thus, ALD may advantageously be conducted at much lower temperatures than CVD. During the ALD process, the substrate temperature may be maintained at a temperature sufficiently low to maintain intact bonds between the chemisorbed chemical(s) and the underlying substrate surface and to prevent decomposition of the chemical(s) (e.g., precursor compositions). The temperature, on the other hand, must be sufficiently high to avoid condensation of the chemical(s) (e.g., precursor compositions). Typically the substrate is kept at a temperature of at least 25° C., in certain embodiments at least 150° C., and in other certain embodiments at least 200° C. Typically the substrate is kept at a temperature of less than or equal to 400° C., in certain embodiments less than or equal to 350° C., and in other certain embodiments less than or equal to 300° C., which, as discussed above, is generally lower than temperatures presently used in typical CVD processes. The first chemical or precursor composition can be chemisorbed at a first temperature, and the surface reaction of the second chemical or precursor composition can occur at substantially the same temperature or, optionally, at a substantially different temperature. Clearly, some small variation in temperature, as judged by those of ordinary skill, can occur but still be considered substantially the same temperature by providing a reaction rate statistically the same as would occur at the temperature of the first chemical or precursor chemisorption. Alternatively, chemisorption and subsequent reactions could instead occur at substantially exactly the same temperature.

For a typical vapor deposition process, the pressure inside the deposition chamber can be at least $10^{-8}$ torr ($1.3 \times 10^{-6}$ Pascal, "Pa"), in certain embodiments at least $10^{-7}$ torr ($1.3 \times 10^{-5}$ Pa), and in other certain embodiments at least $10^{-6}$ torr ($1.3 \times 10^{-4}$ Pa). Further, deposition pressures are typically less than or equal to 20 torr ($2.7 \times 10^3$ Pa), in certain embodiments less than or equal to 5 torr ($6.7 \times 10^2$ Pa), and in other certain embodiments less than or equal to 2 torr ($2.7 \times 10^2$ Pa). Typically, the deposition chamber is purged with an inert carrier gas after the vaporized precursor composition(s) have been introduced into the chamber and/or reacted for each cycle. The inert carrier gas/gases can also be introduced with the vaporized precursor composition(s) during each cycle.

The reactivity of a precursor composition can significantly influence the process parameters in ALD. Under typical CVD process conditions, a highly reactive chemical (e.g., a highly reactive precursor composition) may react in the gas phase generating particulates, depositing prematurely on undesired surfaces, producing inadequate films, and/or inadequate step coverage or otherwise yielding non-uniform deposition. For at least such reason, a highly reactive chemical might be considered not suitable for CVD. However, some chemicals not suitable for CVD are superior in precursor compositions for ALD. For example, if the first chemical is gas phase reactive with the second chemical, such a combination of chemicals might not be suitable for CVD, although they could be used in ALD. In the CVD context, concern might also exist regarding sticking coefficients and surface mobility, as known to those skilled in the art, when using highly gas-phase reactive chemicals, however, little or no such concern would exist in the ALD context.

Crystalline tantalum pentoxide formed adjacent to at least a portion of a surface of a ruthenium-containing material can be crystallographically textured (e.g., c-axis textured). For example, a tantalum pentoxide layer can be formed adjacent to or directly on a ruthenium-containing material having a hexagonal close-packed structure in order to form a crystalline tantalum pentoxide layer, as deposited and/or after annealing. In certain embodiments, the as-deposited crystalline tantalum pentoxide layer has a hexagonal close-packed structure, in other embodiments a crystallographically textured hexagonal close-packed structure, and in other embodiments a c-axis crystallographically textured hexagonal close-packed structure.

As stated above, the use of the compounds and methods of forming crystalline tantalum pentoxide of the present disclosure are beneficial for a wide variety of thin film applications in semiconductor structures, particularly those using high dielectric permittivity materials. For example, such applications include gate dielectrics and capacitors such as planar cells, trench cells (e.g., double sidewall trench capacitors), stacked cells (e.g., crown, V-cell, delta cell, multi-fingered, or cylindrical container stacked capacitors), as well as field effect transistor devices.

Figure 2:
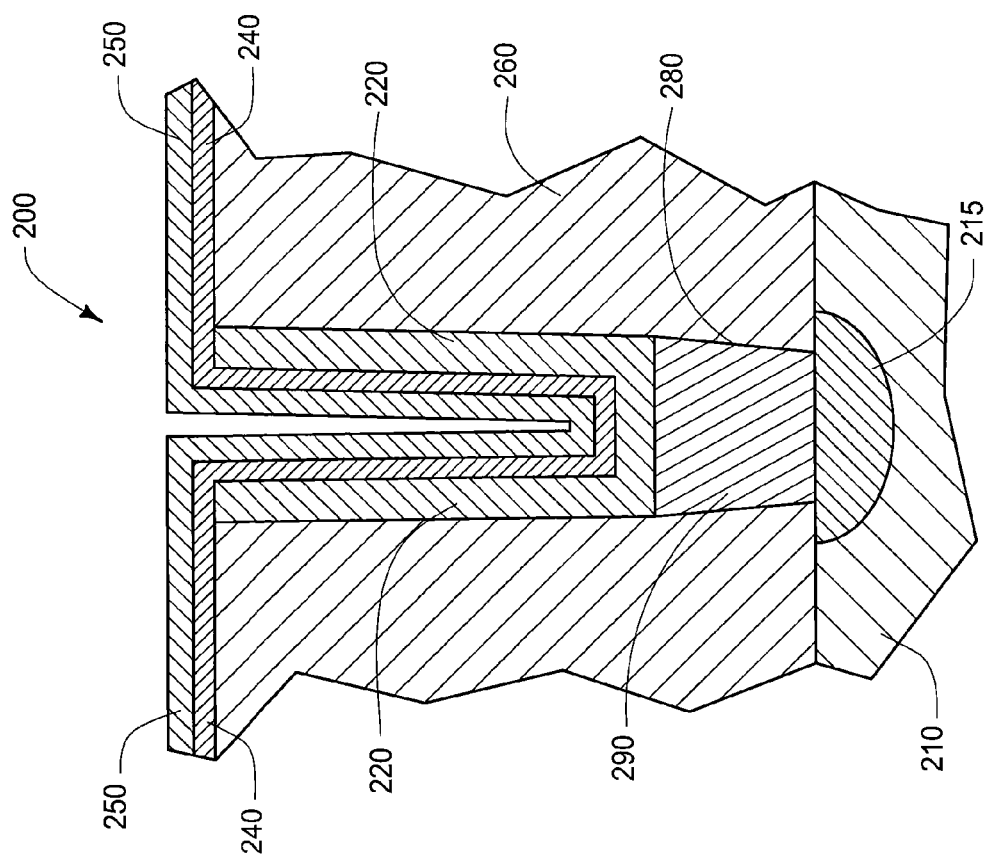
FIG. 2 is a schematic side view illustrating an example capacitor construction having a tantalum pentoxide dielectric layer adjacent to at least a portion of a ruthenium-containing electrode as further described in the present disclosure.

FIG. 2 shows an example of the ALD formation of metal-containing layers of the present disclosure as used in an example capacitor construction. Referring to FIG. 2, capacitor construction 200 includes substrate 210 having conductive diffusion area 215 formed therein. Substrate 210 can include, for example, silicon. An insulating material 260, such as BPSG, is provided over substrate 210, with contact opening 280 provided therein to diffusion area 215. Conductive material 290 fills contact opening 280, and may include, for example, tungsten or conductively doped polysilicon. Capacitor construction 200 includes a first capacitor having a ruthenium-containing material as a first electrode (a bottom electrode) 220, a tantalum pentoxide dielectric layer 240 which may be formed by methods as described herein, and a second capacitor electrode (a top electrode) 250. In some embodiments, ruthenium-containing material of first electrode 220 is as described herein, having at least one oxygen-containing surface (not shown in FIG. 2) that is contacted as described herein with at least one treating composition, such as water vapor, to remove at least a portion of the oxygen prior to deposition of the tantalum pentoxide dielectric layer 240. The tantalum pentoxide dielectric layer 240 may be formed as described herein on at least a portion of the ruthenium-containing material of the first electrode 220. The second capacitor electrode 250, formed on at least a portion of the crystalline tantalum pentoxide dielectric layer 250, may optionally comprise ruthenium metal.

It is to be understood that FIG. 2 is an example construction, and methods as described herein can be useful for forming materials adjacent to any substrate as described herein, for example semiconductor structures, and that such applications include, but are not limited to, capacitors such as planar cells, trench cells, (e.g., double sidewall trench capacitors), stacked cells (e.g., crown, V-cell, delta cell, multi-fingered, or cylindrical container stacked capacitors), as well as field effect transistor devices.

Furthermore, a diffusion barrier material (not shown) may optionally be formed over the tantalum pentoxide dielectric layer 240, and may, for example, include TiN, TaN, metal silicide, or metal silicide-nitride. While the diffusion barrier material is described as a distinct material, it is to be understood that the barrier materials may include conductive materials and can accordingly, in such embodiments, be understood to include at least a portion of the capacitor electrodes. In certain embodiments that include a diffusion barrier material, an entirety of a capacitor electrode can include conductive barrier materials.

EXAMPLES

Example 1

A deposition chamber was set up with pneumatic valves under computer control to pulse valves open in sequential manner. Two reservoirs connected to the chamber contained DI water and tantalum fluoride ($TaF_5$). The substrate was silicon dioxide having a top layer of elemental ruthenium having oxygen on the surface thereof and was maintained at 400° C. for the treatment for removal of oxygen and deposition of tantalum pentoxide. XPS surface spectra analysis of the substrate detected oxygen and ruthenium. Carbon was not resolved on the surface or in the bulk. The surface concentrations of oxygen and ruthenium were 36.7 atomic percent and 63.3 atomic percent, respectively.

Water vapor was introduced to the deposition chamber to contact the ruthenium top layer at 400° C. and 2 torr for 3 minutes. Argon was introduced in a 10-second purge, followed by a 20-second pump down under dynamic vacuum. The tantalum fluoride and water vapor were then alternately pulsed into the deposition chamber to form the crystalline tantalum pentoxide. Each cycle involved a 5-second pulse of tantalum fluoride and a 5-second pulse of water vapor. The tantalum precursor and water vapor were introduced with helium carrier gas, using mass flow controllers set at 100 sccm. After 100 cycles a tantalum pentoxide film 100 Å thick was obtained. A subsequent X-ray crystallographic scan of the tantalum pentoxide layer indicated a peak at 2-theta equal to 23 degrees, indicating a c-axis crystallographically textured tantalum pentoxide layer.

Example 2

Same as EXAMPLE 1, except instead of one reservoir containing water and contacting the substrate with water vapor, one reservoir contained hydrogen and the substrate was contacted with 200 W $H_2$ plasma at 350° C. and 2 torr for 3 minutes prior to deposition of the crystalline tantalum pentoxide. A subsequent X-ray crystallographic scan of the tantalum pentoxide layer indicated a peak at 2-theta equal to 23 degrees, indicating a c-axis crystallographically textured tantalum pentoxide layer.

Example 3

Same as EXAMPLE 1, except instead of one reservoir containing water and contacting the substrate with water vapor, one reservoir contained ammonia and the substrate was contacted with 400 W $NH_3$ plasma at 350° C. and 2 torr for 3 minutes prior to deposition of the crystalline tantalum pentoxide. A subsequent X-ray crystallographic scan of the tantalum pentoxide layer indicated a peak at 2-theta equal to 23 degrees, indicating a c-axis crystallographically textured tantalum pentoxide layer.

Comparative Example 1

Same as EXAMPLE 1, except the substrate was not contacted with water vapor prior to tantalum pentoxide deposition. A subsequent X-ray crystallographic scan of the tantalum pentoxide layer indicated no significant peak at 2-theta equal to 23 degrees, indicating that the tantalum pentoxide layer was not substantially c-axis crystallographically textured.

Comparative Examples 2, 3, and 4

Same as EXAMPLE 1, except each respective substrate was contacted in situ for only 10, 30, and 60 seconds, respectively, prior to tantalum pentoxide deposition. A subsequent X-ray crystallographic scan of the tantalum pentoxide layer on each respective substrate indicated no significant peak at 2-theta equal to 23 degrees, indicating that the tantalum pentoxide layer on each respective substrate was not substantially c-axis crystallographically textured.

Examples 4, 5, 6, and 7

Same as EXAMPLE 1, except each respective substrate was contacted for 2, 3, 6, and 9 minutes, respectively, in situ prior to tantalum pentoxide deposition. A subsequent X-ray crystallographic scan of the tantalum pentoxide layer on each respective substrate indicated a peak at 2-theta equal to 23 degrees, indicating a c-axis crystallographically textured tantalum pentoxide layer on each respective substrate.

Example 8

Same as EXAMPLE 1, except the substrate was contacted for 20 minutes in situ prior to tantalum pentoxide deposition. A subsequent X-ray crystallographic scan of the tantalum pentoxide layer indicated a peak at 2-theta equal to 23 degrees, indicating a c-axis crystallographically textured tantalum pentoxide layer.

Example 9

Same as EXAMPLE 8, except an XPS surface spectra analysis was conducted after the substrate was contacted for 20 minutes in situ, but prior to deposition of the tantalum pentoxide. After the substrate was contacted with water vapor for 20 minutes, the XPS surface spectra analysis of the substrate detected oxygen and ruthenium in concentrations of 19.1 atomic percent oxygen and 80.9 atomic percent ruthenium. Carbon was not resolved on the surface or in the bulk.

Example 10

Same as EXAMPLE 8, except the ruthenium layer on the substrate contained a capacitor structure thereon and was contacted with water vapor for 20 minutes in situ prior to tantalum pentoxide deposition. A subsequent X-ray crystallographic scan of the tantalum pentoxide layer indicated a peak at 2-theta equal to 23 degrees, indicating a c-axis crystallographically textured tantalum pentoxide layer.

Example 11

Same as EXAMPLE 1, except the ruthenium layer on the substrate had a blanket film topology and was contacted for 20 minutes in situ prior to tantalum pentoxide deposition at 375° C. A subsequent X-ray crystallographic scan of the tantalum pentoxide layer indicated a significant peak at 2-theta equal to 23 degrees, indicating a c-axis crystallographically textured tantalum pentoxide layer.

Example 12

Same as EXAMPLE 11, except the ruthenium layer on the substrate had a more aggressively structured topology and was contacted for 20 minutes at 375° C. in situ prior to tantalum pentoxide deposition at 375° C. A subsequent X-ray crystallographic scan of the tantalum pentoxide layer indicated a significant peak at 2-theta equal to 23 degrees, indicating a c-axis crystallographically textured tantalum pentoxide layer.

The complete disclosures of the patents, patent documents, and publications cited herein are incorporated by reference in their entirety as if each were individually incorporated. Various modifications and alterations to the embodiments described herein will become apparent to those skilled in the art without departing from the scope and spirit of the present disclosure. It should be understood that this disclosure is not intended to be unduly limited by the illustrative embodiments and examples set forth herein and that such examples and embodiments are presented by way of example only with the scope of the disclosure intended to be limited only by the claims set forth herein as follows. As used herein, the term "comprising," which is synonymous with "including" or "containing," is inclusive, open-ended, and does not exclude additional unrecited elements or method steps.

What is claimed is:

1. A method of making a capacitor comprising:
    providing a first electrode comprising a crystalline ruthenium-containing material comprising at least one oxygen-containing surface;
    contacting the first electrode with low pressure water vapor at a temperature of less than or equal to 500° C. for from 2-20 minutes to remove at least a portion of the oxygen from the at least one oxygen-containing surface;
    forming a crystalline tantalum pentoxide material on at least a portion of the crystalline ruthenium-containing material; and
    forming a second electrode on at least a portion of the crystalline tantalum pentoxide material.

2. The method of claim 1, wherein the first electrode comprises a blanket film topology.

3. The method of claim 1, wherein the first electrode comprises a DRAM topology.

4. A method of forming a crystalline oxide on a substrate comprising:
    contacting at least a portion of a substrate comprising a ruthenium-containing material having at least one oxygen-containing surface with low pressure water vapor at a temperature of less than or equal to 500° C. for from 2-20 minutes to remove oxygen from the at least one oxygen-containing surface; and
    contacting at least a portion of the ruthenium-containing material wherefrom the water vapor removed oxygen with at least one tantalum-containing precursor compound using a vapor deposition process to form a crystalline tantalum pentoxide material, wherein the tantalum is nucleated on a surface of ruthenium-containing material to form crystallographically textured tantalum pentoxide.

5. The method of claim 4 wherein crystalline tantalum pentoxide has a thickness of from 60Å to 200Å.

6. The method of claim 4 wherein the ruthenium-containing material is formed on the lowest semiconductive surface of the substrate.

7. The method of claim 4 wherein the ruthenium-containing material is formed over a conductive material comprising tungsten or conductively doped polysilicon.

8. The method of claim 7 wherein the conductive material is over a conductive diffusion area of the substrate.

* * * * *